United States Patent
Toh et al.

(10) Patent No.: US 8,426,246 B2
(45) Date of Patent: Apr. 23, 2013

(54) VENTED DIE AND PACKAGE

(75) Inventors: Chin Hock Toh, Singapore (SG); Hao Liu, Singapore (SG); Ravi Kanth Kolan, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 13/400,578

(22) Filed: Feb. 21, 2012

(65) Prior Publication Data

US 2012/0149150 A1    Jun. 14, 2012

Related U.S. Application Data

(62) Division of application No. 12/133,377, filed on Jun. 5, 2008, now Pat. No. 8,143, 719.

(60) Provisional application No. 60/942,460, filed on Jun. 7, 2007.

(51) Int. Cl.
    *H01L 21/00* (2006.01)
(52) U.S. Cl.
    USPC ............ 438/108; 438/107; 438/109; 438/110
(58) Field of Classification Search ........... 438/107–110
    See application file for complete search history.

(56) References Cited

U.S. PATENT DOCUMENTS

| | | | |
|---|---|---|---|
| 5,721,450 A | 2/1998 | Miles | |
| 5,770,889 A | 6/1998 | Rostoker et al. | |
| 5,814,889 A * | 9/1998 | Gaul | 257/773 |
| 6,201,300 B1 | 3/2001 | Tseng et al. | |
| 6,234,373 B1 | 5/2001 | Wark | |
| 6,242,286 B1 | 6/2001 | Cellarosi | |
| 6,265,244 B1 | 7/2001 | Hayashi et al. | |
| 6,383,846 B1 * | 5/2002 | Shen et al. | 438/127 |
| 6,519,844 B1 * | 2/2003 | Nagarajan et al. | 29/841 |
| 6,577,013 B1 | 6/2003 | Glenn et al. | |
| 6,772,512 B2 | 8/2004 | Tsai et al. | |
| 6,809,753 B2 | 10/2004 | Tu | |
| 7,058,247 B2 * | 6/2006 | Crow et al. | 385/14 |
| 7,087,513 B2 | 8/2006 | Fasano et al. | |
| 7,151,009 B2 | 12/2006 | Kim et al. | |
| 7,285,791 B2 | 10/2007 | Beeson et al. | |
| 7,288,474 B2 | 10/2007 | Casey et al. | |
| 7,485,968 B2 | 2/2009 | Enquist et al. | |
| 7,712,211 B2 | 5/2010 | Chia et al. | |
| 7,786,562 B2 | 8/2010 | Ozguz et al. | |
| 2004/0164454 A1 | 8/2004 | Gartstein et al. | |
| 2005/0202651 A1 | 9/2005 | Akram | |
| 2005/0253213 A1 | 11/2005 | Jiang et al. | |
| 2006/0027934 A1 | 2/2006 | Edelstein et al. | |
| 2006/0046346 A1 | 3/2006 | Benson et al. | |
| 2006/0099736 A1 | 5/2006 | Nagar et al. | |
| 2006/0103021 A1 | 5/2006 | Liu et al. | |
| 2006/0186538 A1 | 8/2006 | Suzuka | |
| 2007/0096263 A1 * | 5/2007 | Furukawa et al. | 257/621 |
| 2007/0164409 A1 | 7/2007 | Holland | |
| 2007/0172982 A1 | 7/2007 | Huang et al. | |
| 2007/0181994 A1 | 8/2007 | Fukase et al. | |

(Continued)

*Primary Examiner* — Bac Au

(74) *Attorney, Agent, or Firm* — Horizon IP Pte. Ltd.

(57) ABSTRACT

A die that includes a substrate having a first and second major surface is disclosed. The die has at least one unfilled through via passing through the major surfaces of the substrate. The unfilled through via serves as a vent to release pressure generated during assembly.

21 Claims, 3 Drawing Sheets

U.S. PATENT DOCUMENTS

| | | |
|---|---|---|
| 2007/0194441 A1 | 8/2007 | Pavier |
| 2007/0210428 A1 | 9/2007 | Tan et al. |
| 2007/0241415 A1* | 10/2007 | Ko et al. .................. 257/415 |
| 2007/0275540 A1 | 11/2007 | Hackitt et al. |
| 2008/0029930 A1 | 2/2008 | Ito et al. |
| 2008/0044985 A1 | 2/2008 | Polinsky et al. |
| 2008/0116544 A1 | 5/2008 | Grinman et al. |
| 2008/0116584 A1 | 5/2008 | Sitaram |
| 2008/0150159 A1* | 6/2008 | Aberin et al. .................. 257/778 |
| 2008/0268638 A1 | 10/2008 | Dertinger et al. |
| 2008/0272476 A1 | 11/2008 | Do et al. |
| 2008/0274589 A1 | 11/2008 | Lee et al. |
| 2008/0293186 A1 | 11/2008 | Hao et al. |
| 2009/0064789 A1 | 3/2009 | Silverbrook et al. |

\* cited by examiner

VENTED DIE AND PACKAGE

CROSS-REFERENCE TO RELATED APPLICATIONS

This application is a divisional application of co-pending U.S. patent application Ser. No. 12/133,377 filed Jun. 5, 2008, which claims priority to U.S. patent application Ser. No. 60/942,460 filed Jun. 7, 2007. These applications are hereby incorporated by reference in their entireties.

BACKGROUND

Miniaturization of consumer electronics with increased functionality and high density memory has long been one of the major drivers in semiconductor packaging developments. Extremely dense electronics can be created by stacking thin silicon chips with interconnections in the vertical direction. Through silicon via (TSV) process is one of the techniques used in the packaging industry which enables stacking of thin silicon integrated circuits (ICs) or dies to provide integration and a potential increase in the physical density of some electronic systems' functions. Additionally, this technology enables potential architectural configurations for 3-dimensional integration of multiple dies.

It is desirable to provide reliable packages with increased density.

SUMMARY

Embodiments relate generally to die and chip packages. More particularly, embodiments relate to 3D chip packages.

In one aspect, a die that includes a substrate having first and second major surfaces is presented. The die includes at least one unfilled through via passing through the major surfaces of the substrate. The unfilled via serves as a vent to release pressure generated during assembly.

A chip package that includes a carrier and a die is disclosed. The carrier has a first and second major surface, wherein the second major surface includes a bonding region. The die is attached to the bonding region. The die includes a substrate having first and second major surfaces and at least one unfilled through via passing through the major surfaces of the substrate. The unfilled via serves as a vent to release pressure generated during assembly.

In another aspect, a method of chip packaging is disclosed. The method includes providing a carrier having a bonding region on one of a top or bottom surface. A die is attached to the bonding region. The die comprises at least one unfilled via through first and second major surfaces of the die to serve as a vent to release pressure generated during assembly.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Embodiments generally relate to preparing chips for packaging and chip packages. Other types of applications can also be useful. Various types of chips or ICs can be packaged. For example, the IC can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The ICs can be incorporated into various products, such as phones, computers, personal digital assistants or other types of suitable products.

Figure 1:
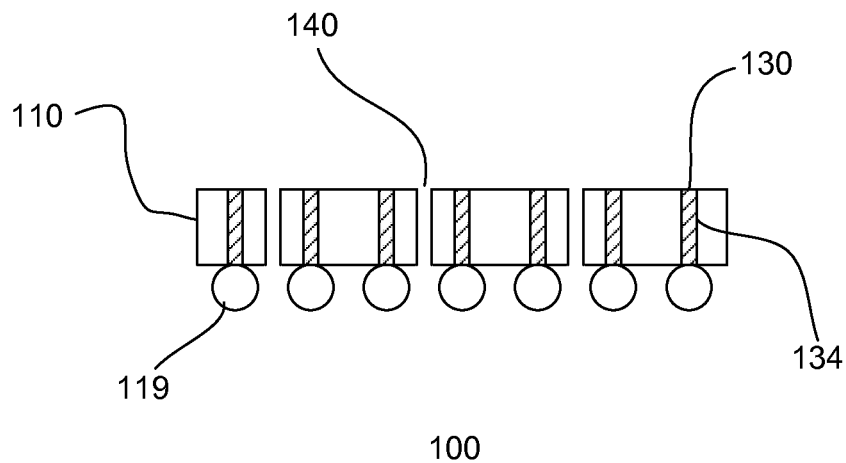
FIG. 1 shows an embodiment of a die.

FIG. 1 shows an embodiment of a die 100. The die comprises a substrate 110 with first (bottom) and second (top) major surfaces. The substrate comprises a semiconductor substrate, such as silicon. Other type of substrates, for example, silicon-on-insulator, are also useful.

The die, for example, comprises a through silicon via (TSV) type of die. Other types of dies are also useful. The TSV die comprises at least one through via 130. The through via passes through the major surfaces of the substrate 110. The thickness of the die can be of a standard available thickness. Generally, the die is part of a wafer with a plurality of dies.

The via can be formed by various techniques. For example, the via can be formed by laser drilling or deep reactive ion etching (DRIE). The via, for example, comprises a tapered sidewall profile. Providing vias with other sidewall profiles are also useful. For example, other tapered sidewall angles, non-tapered sidewalls or a combination thereof are also useful.

The via is filled with a conductive material to form a via contact 134. Various types of conductive materials can be used. In one embodiment, the via is filled with copper by electro or electroless plating. Other materials and/or processes for filling the vias are also useful.

Generally, the die comprises a plurality of via contacts. The via contacts can be arranged in a desired pattern. For example, the contacts can be arranged in a grid or array pattern. Other patterns, such as locating the contacts at about the periphery of the die, are also useful.

In one embodiment, the bottom surface of the die comprises die contacts 119. The die contacts, for example, comprise die bumps. The die contacts are coupled to the via contacts. Various types of materials, such as solders can be used. The solder, for example, comprises lead or lead free solder. Under bump metallization processes can be employed on the major surfaces of the die to facilitate interconnection between the die and the via contacts. The via and die contacts can be formed from the same or different materials.

In alternative embodiments, via and die contacts can be formed from solder. The die contact, for example, is located on top of the die. Forming via and die contacts from solder is described in concurrently filed patent application titled "Through Silicon Via Dies and Packages" which is commonly assigned to United Test and Assembly Center, Ltd. and which is herein incorporated by reference for all references.

In one embodiment, the die comprises at least one unfilled through via 140. The unfilled through via extends through the major (e.g., top and bottom) surfaces of the die. The unfilled via serves as a vent to release pressure, such as water vapor pressure, that can be generated during packaging. Generally, the die comprises a plurality of unfilled through vias. The unfilled vias can be distributed over the die to adequately release pressure during packaging.

The unfilled vias can be formed during the formation of the vias which are to be filled. The unfilled vias can be masked during filling to prevent them from being filled. Alternatively, the unfilled vias are formed after the vias are filled.

Figure 2:
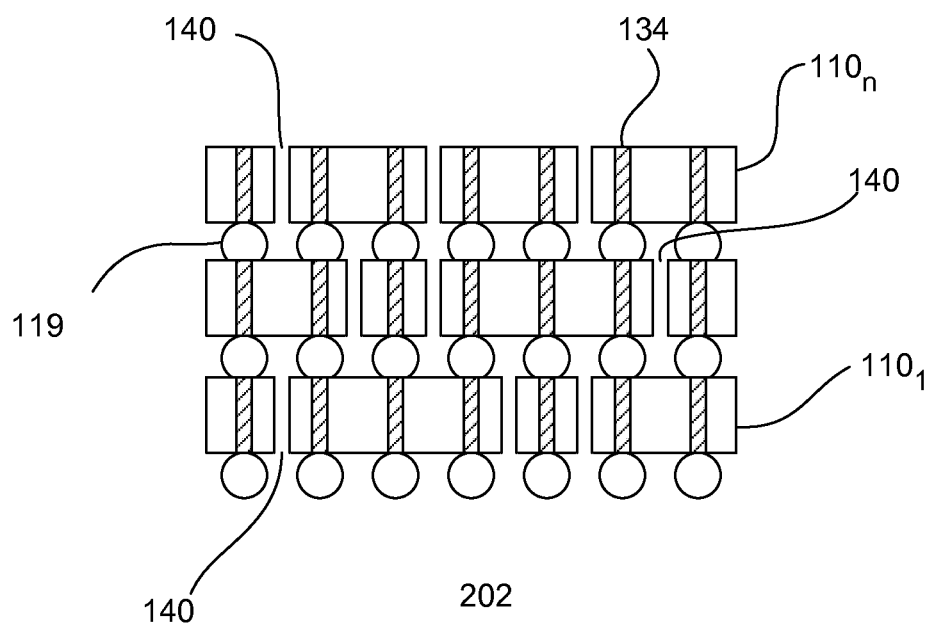
FIG. 2 shows an embodiment of a die stack.

FIG. 2 illustrates an embodiment of a die stack 202. The die stack comprises n number of dies $110_1$-$110_n$, where n is $\geq 2$. The dies, for example, comprise TSV chips as described in FIG. 1. As shown, the die stack comprises 3 dies. Providing a die stack with other numbers of dies is also useful. In one embodiment, die contacts of a die (n=$n^{th}$) of the stack are coupled to the vias of the die below (n=n−1). Alternatively, bonding pads can be provided on the top and/or bottom surfaces of a die which are coupled to the vias. The die contacts can be coupled to the bonding pads. The die contacts can be reflowed to form a permanent bond between the dies, forming the die stack. The dies of the die stack can be of the same type and/or size. Providing a die stack having chips which are different types and/or sizes is also useful. As for the die at the top of the stack, it can be a TSV die or other types of dies. The top die, for example, can be a flip chip.

The stacking of the dies can be achieved by, for example, providing a second TSV die on top of the first TSV die such that the via contacts and die contacts of both dies are aligned. Flux can be provided on the contacts to hold the dies in place. The die contacts are then reflowed to form an interconnection between the first and second dies.

The cavity between the dies can be filled with an underfill material to protect the die contacts. Various types of underfill materials, such as materials which include max fillers, moldable underfills, epoxy mold compound or epoxy can be used. Further dies may be stacked on top of the second die in the same manner. Other methods of stacking the dies may also be useful. The die to die interface may include gaps or voids due to incomplete filling by the underfill. Incomplete filling can occur, for example, with low volume solder bumps and/or tight interconnect standoff heights.

In one embodiment, at least one of the dies of the stack comprises unfilled vias 140. Some or all the dies of the die stack can include unfilled vias. In a preferred embodiment, each die in the die stack comprises at least one unfilled via. The unfilled vias of the dies form a ventilation network to release pressure that can be produced during assembly. Various configurations of dies with unfilled vias can be used to form the ventilation network.

Moisture in the air can penetrate into the die stack, concentrating at the voids that may be present at the die to die interface resulting from incomplete underfill. During high temperature processes, such as reflow or molding, the moisture expands in the voids, exerting pressure on the stack. This can cause cracking within the dies and the package, adversely affecting reliability or yields. By providing unfilled vias, pressure that can be generated is released, reducing or avoiding problems associated to pressure buildup.

The dies of the stack can be assembled using various techniques. In one embodiment, the dies can be assembled using die to die techniques. For example, a wafer is diced and separated into individual dies. The individual dies can be stacked to form the stack. Alternatively, die to wafer technique can be used. In die to wafer, a die is attached to a wafer. When the die stack is completed, the wafer is diced to form individual die stacks. In yet another embodiment, wafer to wafer technique can be employed. In wafer to wafer process, wafers are stacked and then diced to form individual stacks.

Figure 3:
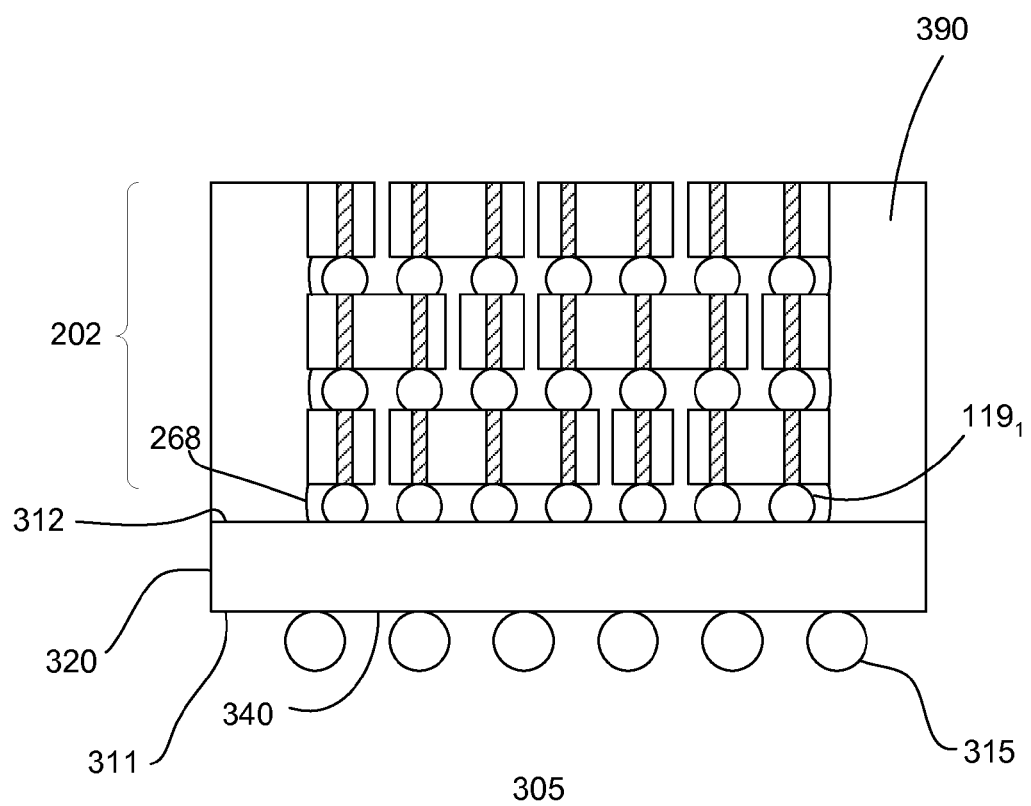
FIG. 3 shows an embodiment of a package.

FIG. 3 shows an embodiment of a package 305. The package includes a carrier or package substrate 320 with bottom and top major surfaces 311 and 312. The carrier, for example, can be a single or multi-layered laminate substrate. Other types of carriers are also useful. In one embodiment, the carrier may comprise vias (not shown). The carrier vias pass through the major surfaces of the carrier. The carrier vias, for example, are unfilled vias, thus forming additional ventilation network to release pressure formed during assembly. Package contacts 315 can be disposed on one of the major surfaces. In one embodiment, the package contacts are located on the bottom surface. The package contacts can comprise spherical shaped structures or balls arranged in a grid pattern to form a BGA. The balls, for example, comprise solder. Various types of solders can be used, such as lead or lead free alloys. Arranging the contacts in other patterns or providing other types of contacts or materials are also useful.

In one embodiment, a die bonding region is provided on the top surface of the carrier. The die bonding region comprises bonding pads. The bonding pads can be arranged in various patterns. For example, the contacts can be arranged in a grid pattern. The pattern of the bonding pads should correspond to the die contact pattern of the die to be mounted thereon. Other types of patterns are also useful. The bonding pads are interconnected to the package contacts on the bottom surface of the carrier.

In one embodiment, a die stack 202 is mounted onto the package. The die stack, for example, comprises a die stack as described in FIG. 2. For example, the die stack comprises n number of dies $110_1$-$110_n$, where n is $\geq 2$, as described in FIG. 2. At least one of the dies of the die stack comprises unfilled vias in accordance with one embodiment. Some or all of the dies of the die stack can include unfilled vias. The unfilled vias, as described, form a ventilation network to release pressure that can be produced during assembly. In one embodiment, die contacts $119_1$ of the bottom chip of the stack are coupled to the bonding pads of the package. Flux can be employed on the contacts to hold the dies in place. Other configurations of mounting the dies or the die stack to the carrier are also useful.

Once the die stack is mounted to the carrier, a reflow can be performed to permanently bond the die stack to the carrier. The reflow, can be performed at a temperature sufficient to melt the package contacts to bond the die stack to the carrier. The reflow process can also be integrated to permanently bond the dies of the stack. Other reflow schemes are also useful.

An underfill 268 can optionally be provided in the cavity formed in between the die and the carrier and the dies to encapsulate and protect the die contacts. The underfill, for example, serves to reduce thermal stress between the die contacts and carrier, improving reliability. Various types of underfill materials, such as materials which include max fillers, moldable underfills, epoxy mold compound or epoxy can be used. Various techniques can be used to provide the underfill in the cavity. The underfill, for example, can be needle-dispensed along the edges of the die and drawn into the space between the die and carrier by capillary action and cured to form a permanent bond. Other techniques for applying the underfill are also useful.

A package cap 390 is formed to encapsulate the die stack. The package cap, for example, comprises mold compound. Various molding techniques can be employed to form the package cap. For example, the cap can be formed by transfer molding. Other techniques for forming the package cap are also useful. The package cap, for example, may also include ventilation channels that also serve as vents to release pressure during assembly.

The unfilled via(s) at the top of the stack, for example, can be optionally filled after reflow and molding processes that involves high temperatures. The unfilled via(s) at the top die may be filled to prevent dust entrapment within the package. For example, the unfilled via(s) may be filled with an insulating material such as an epoxy. Providing other types of materials is also useful.

Figure 4:
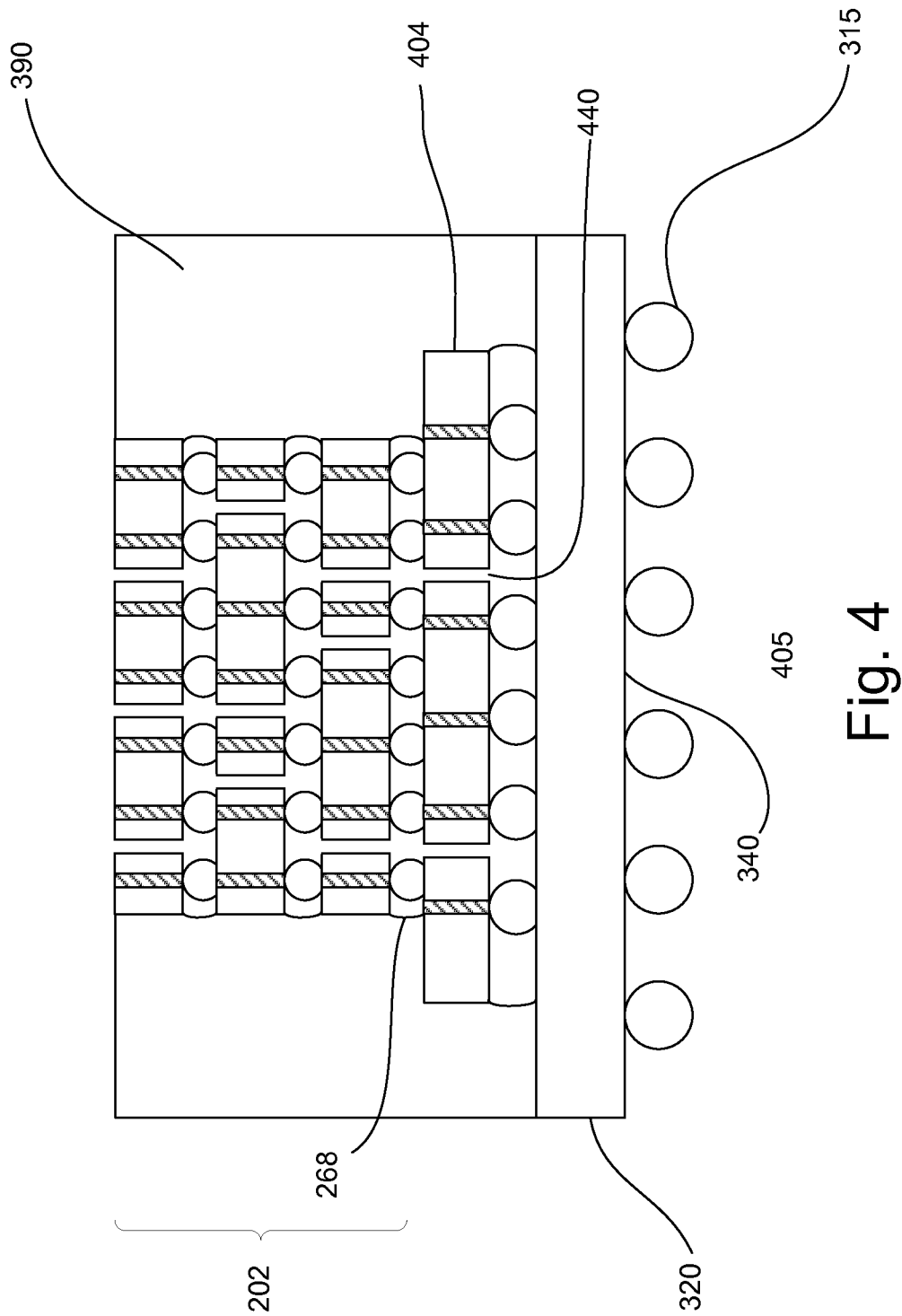
FIG. 4 shows an alternative embodiment of a die package.

FIG. 4 shows an alternative embodiment of a package 405. The package is similar to that of FIG. 3 except that the die stack 202 is formed on a mother die 404. The mother die, as shown, comprises a die which is larger than the other dies of the stack. Other configurations of dies are also useful. The mother die 404, may be an active silicon die or a dummy silicon interposer. In the latter case, the dummy silicon interposer functions to alleviate CTE mismatch between the die stack and the package substrate. In one embodiment, the dies can be stacked on the mother die using chip to wafer bonding. For example, the dies of the stack are mounted onto a wafer with the mother die. The mother die, for example, comprises unfilled vias 440. After the stack is finished, the wafer of the mother die is diced to form individual stacks which are mounted onto the package substrate 320. The die stack with the mother die can be packaged as similarly described in FIG. 3.

The invention may be embodied in other specific forms without departing from the spirit or essential characteristics thereof. For example, for purposes of this disclosure and the claims that follow, the terms "coupled" and "connected" may have been used to describe how various elements interface. Such described interfacing of various elements may be either direct or indirect. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of chip packaging comprising:
   providing a package substrate having a bonding region on one of a top or bottom surface;
   attaching and bonding a die directly to the bonding region, wherein the die which is directly bonded to the bonding region comprises unfilled and filled vias through first and second major surfaces of the die, wherein an unfilled via serves as a vent to release pressure generated during assembly; and
   forming a package cap encapsulating the die having the unfilled and filled vias.

2. The method of claim 1 further comprising attaching a die stack comprising a plurality of dies, wherein at least one of the dies of the die stack comprises at least one unfilled via through first and second major surfaces of the die to serve as a vent to release pressure generated during assembly.

3. The method of claim 2 wherein each die of the die stack comprises at least one unfilled via to form a ventilation network for the die stack.

4. The method of claim 2 comprises forming the die stack on top of a mother die, wherein the mother die includes an active die or a dummy interposer.

5. The method of claim 2 wherein the die stack includes a plurality of through vias, and comprising filling the vias with conductive materials to form via contacts.

6. The method of claim 2 wherein the die stack comprises dies of a same type.

7. The method of claim 2 wherein the die stack comprises at least one die which is of a different type than other dies of the die stack.

8. The method of claim 2 wherein a top die of the die stack comprises a flip chip.

9. The method of claim 1 wherein the filled via is filled with conductive material and the unfilled via is masked during filling of a via to form the filled via.

10. The method of claim 1 wherein the filled via is filled with conductive material and the unfilled via is formed after filling a via to form the filled via.

11. A method of chip packaging comprising:
    providing a carrier having a bonding region on one of a top or bottom surface;
    attaching a die stack comprising a plurality of dies to the bonding region, wherein each die of the die stack comprises at least one unfilled via through first and second major surfaces of the dies to serve as a vent to release pressure generated during assembly; and
    filling the unfilled via of a top die of the die stack with insulating material.

12. The method of claim 11 wherein the die stack further comprises a plurality of through vias, and comprising filling the vias with conductive materials to form via contacts.

13. A method of forming a semiconductor package comprising:
    providing a plurality of dies, each of the dies having first and second major surfaces, wherein the dies are singulated dies of a wafer having a plurality of dies;
    forming a plurality of through vias within the die, the plurality of vias include conductive materials to form via contacts;
    forming at least one unfilled through via within each of the dies, the unfilled through via passing through the major surfaces of the dies;
    stacking the plurality of dies having the via contacts and the at least one unfilled through via within each die to form a die stack;
    attaching and bonding the die stack to a package substrate, wherein the unfilled through vias of the die stack which is bonded to the package substrate allow passage of air between the major surfaces of the dies to serve as a vent to release pressure generated during assembly; and
    forming a package cap encapsulating the die stack having the via contacts and the unfilled through vias.

14. The method of claim 13 further comprises providing die contacts which are only coupled to the via contacts on the first or second major surface.

15. The method of claim 14 comprises:
    reflowing the die contacts, wherein the unfilled through via within each die remains unfilled during the reflowing process and forming the package cap.

16. The method of claim 14 comprises:
    providing underfill material between cavity of the first and second dies, wherein the unfilled through via within a top die of the die stack remains unfilled during providing the underfill material.

17. The method of claim 13 wherein forming the at least one unfilled through via is performed after forming the via contacts.

18. A method of forming a semiconductor package comprising:
   providing a package substrate having a bonding region on one of a top or bottom surface;
   attaching a die stack comprising at least a first die and a second die on top of the first die on the package substrate, wherein the first die is directly bonded to the bonding region of the package substrate and the first die comprises unfilled and filled through vias through first and major surfaces of the first die, wherein an unfilled through via allows passage of air between the major surfaces of the die to serve as a vent to release pressure generated during assembly; and
   forming a package cap encapsulating the die stack having the unfilled and filled through vias in the first die.

19. The method of claim 18 wherein the second die comprises at least one unfilled through via.

20. The method of claim 19 wherein the die stack comprises three or more dies, wherein at least one of the three or more dies comprises at least one unfilled through via.

21. The method of claim 19 wherein the die stack comprises at least one die which is of a different type than other dies of the die stack.

* * * * *